(12) United States Patent
Higashi

(10) Patent No.: US 7,242,238 B2
(45) Date of Patent: Jul. 10, 2007

(54) DRIVE CIRCUIT FOR VOLTAGE DRIVEN TYPE SEMICONDUCTOR ELEMENT

(75) Inventor: Kazuyuki Higashi, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 55 days.

(21) Appl. No.: 11/077,208

(22) Filed: Mar. 11, 2005

(65) Prior Publication Data

US 2005/0206438 A1 Sep. 22, 2005

(30) Foreign Application Priority Data

Mar. 19, 2004 (JP) .............................. 2004-081571

(51) Int. Cl.
*H03K 17/687* (2006.01)

(52) U.S. Cl. ..................... 327/427; 327/374; 327/383; 327/432

(58) Field of Classification Search ..................... None
See application file for complete search history.

(56) References Cited

U.S. PATENT DOCUMENTS

| | | | | |
|---|---|---|---|---|
| 5,210,479 A | * | 5/1993 | Kimura et al. ............... | 318/727 |
| 5,625,312 A | * | 4/1997 | Kawakami et al. .......... | 327/483 |
| 6,054,890 A | * | 4/2000 | Giacomo ..................... | 327/375 |
| 6,127,746 A | * | 10/2000 | Clemente ..................... | 307/131 |
| 6,348,819 B1 | * | 2/2002 | Ten Pierick et al. ......... | 327/110 |
| 6,570,413 B1 | * | 5/2003 | Kumagai et al. ............ | 327/108 |
| 2003/0075748 A1 | | 4/2003 | Furuie et al. | |

FOREIGN PATENT DOCUMENTS

| | | |
|---|---|---|
| JP | 5-336732 A | 12/1993 |
| JP | 6-291361 A | 10/1994 |
| JP | 10-051285 A | 2/1998 |
| JP | 10-150764 A | 6/1998 |
| JP | 10-248237 A | 9/1998 |
| JP | 2002-135097 A | 5/2002 |
| JP | 2002-281761 A | 9/2002 |
| JP | 2003-070233 A | 3/2003 |

* cited by examiner

*Primary Examiner*—Timothy P. Callahan
*Assistant Examiner*—An T. Luu
(74) *Attorney, Agent, or Firm*—Foley & Lardner LLP

(57) ABSTRACT

A drive circuit for a voltage driven type semiconductor element, includes: an electrical charge discharge unit that discharges electrical charge from a gate terminal of a voltage driven type semiconductor element when the voltage driven type semiconductor element is turned OFF; and an electrical discharge control unit that detects a time variation of a collector voltage of the voltage driven type semiconductor element, and controls electric discharge by the electrical charge discharge unit according to the time variation of the collector voltage which has been detected.

20 Claims, 3 Drawing Sheets

US 7,242,238 B2

DRIVE CIRCUIT FOR VOLTAGE DRIVEN TYPE SEMICONDUCTOR ELEMENT

BACKGROUND OF THE INVENTION

1. Field of the Invention

The present invention relates to a drive circuit for a voltage driven semiconductor element which supplies a drive electrical current to a load.

2. Description of Related Art

In circuits for switching and driving a voltage driven type semiconductor element such as an insulated gate bipolar transistor (IGBT), there is a per se known technique (refer to Japanese Laid-Open Patent Publication No. H10-51285) of suppressing voltage surges generated when the IGBT which has generated excess electrical current is turned OFF, and the like. In the drive circuit described in that document, the voltage surge is mitigated by suppressing the rate of change of the collector current upon turning OFF by making the resistance value of the gate resistance greater when excess current has been generated in the IGBT.

SUMMARY OF THE INVENTION

Generally a certain dead time is specified for a system to which the drive circuit is fitted, and it is necessary to turn OFF the IGBT during this dead time. The down side to suppressing the rate of change of the collector current (the rate of its reduction with time) upon turning OFF simply by making the gate resistance value greater as described above, is that the time period until the IGBT is turned OFF becomes undesirably long. In other words, if priority is given to turning OFF the IGBT during the dead time, this puts a limitation upon the magnitude of the gate resistance value. As a result, the suppression of the rate of change of the collector electrical current becomes insufficient. On the other hand, if priority is given to suppressing the rate of change of the collector current, no limitation is imposed upon the size of the gate resistance value. As a result, the time period for turning the IGBT OFF becomes long. Thus, there has been a difficulty in ensuring that suppression of the rate of change of the collector electrical current and shortening of the time period for turning OFF are compatible with one another.

According to the first aspect of the present invention, a drive circuit for a voltage driven type semiconductor element comprises: an electrical charge supply means for supplying electrical charge to a gate terminal of a voltage driven type semiconductor element when the voltage driven type semiconductor element is turned ON; an electrical charge discharge means for discharging electrical charge from the gate terminal of the voltage driven type semiconductor element when the voltage driven type semiconductor element is turned OFF; and an electrical discharge control means for controlling electric discharge by the electrical charge discharge means so as to bring a rate of reduction with time of the collector electrical current of the voltage driven type semiconductor element, when it is turned OFF, to approach a predetermined value.

According to the second aspect of the present invention, a drive circuit for a voltage driven type semiconductor element comprises: an electrical charge discharge means for discharging electrical charge from a gate terminal of a voltage driven type semiconductor element when the voltage driven type semiconductor element is turned OFF; and an electrical discharge control means for detecting a time variation of a collector voltage of the voltage driven type semiconductor element, and for controlling electric discharge by the electrical charge discharge means according to the time variation of the collector voltage which has been detected.

In the above, "unit" may be substituted for "means".

DESCRIPTION OF THE PREFERRED EMBODIMENT(S)

Figure 1:
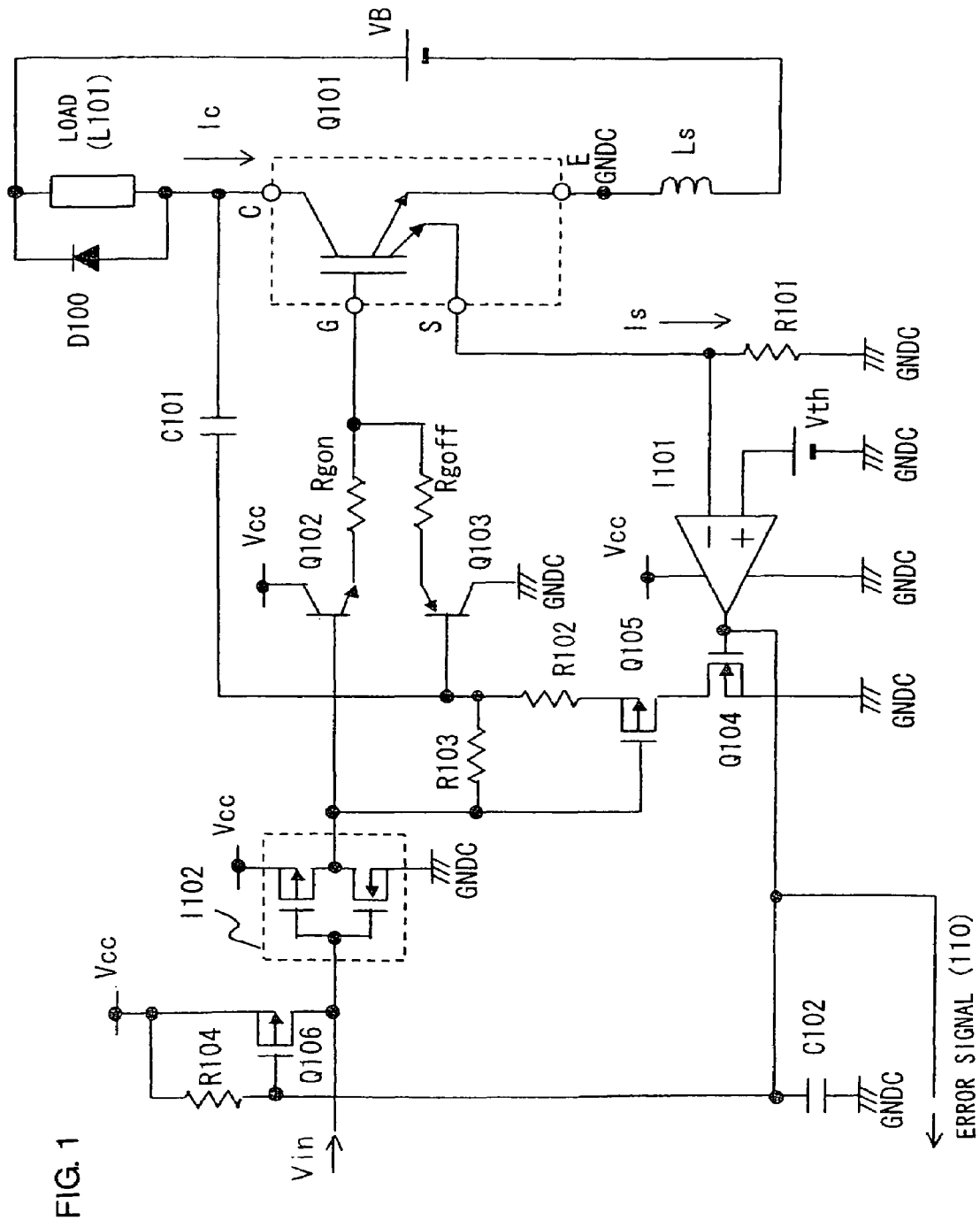
FIG. 1 is a figure for explanation of an IGBT drive circuit according to a preferred embodiment of the present invention.

In the following, a preferred embodiment for implementing the present invention will be explained with reference to the figures. FIG. 1 is a figure for explanation of a drive circuit for an IGBT (an insulated gate bipolar transistor) according to the preferred embodiment of the present invention. In FIG. 1, to an IGBT (Q101), there are provided a gate terminal (G), a collector terminal (C), an emitter terminal (E) which is connected to an emitter main cell, and a sense terminal (S) which is connected to a cell for detecting the collector current.

The collector terminal (C) of the IGBT (Q101) is connected to one end of a load (L101), and the other end of the load (L101) is connected to the positive side of a voltage supply VB. The emitter terminal (E) of the IGBT (Q101) is connected to the negative side of the voltage supply VB. When the IGBT (Q101) is ON, a collector current (Ic) in the direction shown in FIG. 1 by the arrow sign flows and drives the load (L101). The parasitic inductance which is present in the electrical current flow path will be supposed to be expressed as (Ls). It should be understood that, in this preferred embodiment, "GNDC" shown in the drawings and written in the specification denotes the electrical potential of the emitter terminal of the IGBT (Q101), while the earth symbol in the figures denotes connection to the emitter terminal of the IGBT (Q101).

The IGBT (Q101) is made so as to perform switching operation (ON/OFF) according to an input voltage Vin which is supplied from a higher level controller which is not shown in the drawings. Having been impedance converted by a buffer IC (I102), this input voltage (Vin) is inputted to the base terminal of an NPN transistor (Q102) for driving a turning on gate of the IGBT (Q101). This buffer IC (I102) has a push-pull structure.

The input voltage (Vin) which has been impedance converted by the buffer IC (I102) is furthermore inputted via a resistor (R103) to the base terminal of a PNP transistor (Q103) for driving a turning off gate. The two transistors (Q102) and (Q103) for gate driving described above are connected to the gate terminal (G) of the IGBT (Q101) via respective gate resistors (Rgon) and (Rgoff) which are connected to the respective emitter terminals of these transistors, so as to be able to vary, respectively, the charge current and the discharge current to the gate terminal (G) of the IGBT (Q101). It should be understood that (Vcc) denotes the voltage supply for the circuit.

The sense terminal (S) of the above described IGBT (Q101) is a terminal which is provided for detecting the collector current of the IGBT (Q101). This sense terminal (S) is connected to the emitter terminal of the IGBT (Q101) via a sense resistor (R101). A current which bears a predetermined current ratio with respect to the emitter current flowing in the IGBT (Q101) flows in the direction shown by the arrow sign as a sense electrical current (IS). A comparator (I101) compares the voltage which is created between the two ends of this sense resistor (R101) with a threshold value voltage (Vth), and outputs the calculated result of this comparison. The voltage which is created in the sense resistor (R101) is inputted to an inverting input (−) terminal of this comparator (I101), while the threshold value voltage (Vth) is inputted to a non-inverting input (+) terminal of the comparator (I101).

With the objective of detecting the time variation (dVce/dt) of the collector voltage (Vce) when the IGBT (Q101) is turned OFF, and of feedback controlling the operation of the above described PNP transistor (Q103) for turning OFF, a capacitor (C101) is provided between the collector terminal (C) of the IGBT (Q101) and the base terminal of the PNP transistor (Q103). Furthermore, with the objective of limiting the amount of feedback detection of this time variation (dVce/dt) of the collector voltage (Vce) in the above described turned OFF state to a predetermined value, an adjusting resistor (R102) is provided between the base terminal of the PNP transistor (Q103) and GNDC. The time variation of the collector voltage may be referred to as the variation with time of the collector voltage or the time base variation of the collector voltage.

The GNDC side terminal of the adjusting resistor (R102) is connected to GNDC via a Pch-MOSFET (Q105) and a Nch-MOSFET (Q104), which are switching elements, so as to change over the above described feedback detection amount according to the conduction state of the IGBT (Q101) When the Pch-MOSFET (Q105) and the Nch-MOSFET (Q104) are both ON, the GNDC side terminal of the adjusting resistor (R102) is connected to the emitter terminal of the IGBT (Q101), while, when either one of the Pch-MOSFET (Q105) and the Nch-MOSFET (Q104) is turned OFF, the GNDC side terminal of the adjusting resistor (R102) is not thus connected.

One of the terminals of the adjusting resistor (R103), whose resistance value is different from that of the adjusting resistor (R102) (R102<R103), is connected to the base terminal of the PNP transistor (Q103) in the same manner as the adjusting resistor (R102), while its other terminal is connected to the output terminal of the buffer IC (I102) and to the gate terminal of the Pch-MOSFET (Q105). The gate terminal of the Nch-MOSFET (Q104) is connected to the output terminal of the above described comparator (I101).

The output terminal of the comparator (I101), furthermore, along with being connected to the voltage supply (Vcc) via a pull up resistor (R104), is also connected to the gate terminal of a Pch-MOSFET (Q106) which is provided for forcibly controlling the signal level of the input voltage (Vin) to H (High) level. In this preferred embodiment, if the input voltage (Vin) is H level, the IGBT (Q101) is turned OFF. The source terminal of this Pch-MOSFET (Q106) is connected to the voltage supply (Vcc), while its drain terminal is connected to the input terminal of the buffer IC (I102). Furthermore, a capacitor (C102) is provided between the output terminal of the comparator (I101) and GNDC.

When the output level of the comparator (I101) changes, the operational ON/OFF states of the Pch-MOSFET (Q106) and the Nch-MOSFET (Q104) both change. The output signal of the comparator (I101) is also outputted to the higher level controller (not shown in the figures) as an error signal (110). The higher level controller is made so as, if the error signal shows the occurrence of an abnormality (i.e., in this embodiment, is L (Low) level), to bring the signal (in other words, the input voltage (Vin)) to perform switching control of the IGBT (Q101) to H level (i.e., it turns the IGBT (Q101) OFF). In the case of building an inverter or the like with a plurality of IGBTs, by utilizing as a trigger signal an error signal (110) which shows that an excess electrical current has occurred in any one of the IGBTs, the higher level controller turns OFF all these IGBTs which constitute the inverter or the like.

The above described capacitor (C102) is provided with the intention of maintaining the output level of the comparator (I101) for a predetermined time period, so that the error signal (110) can be reliably recognized by the higher level controller.

Figure 2:
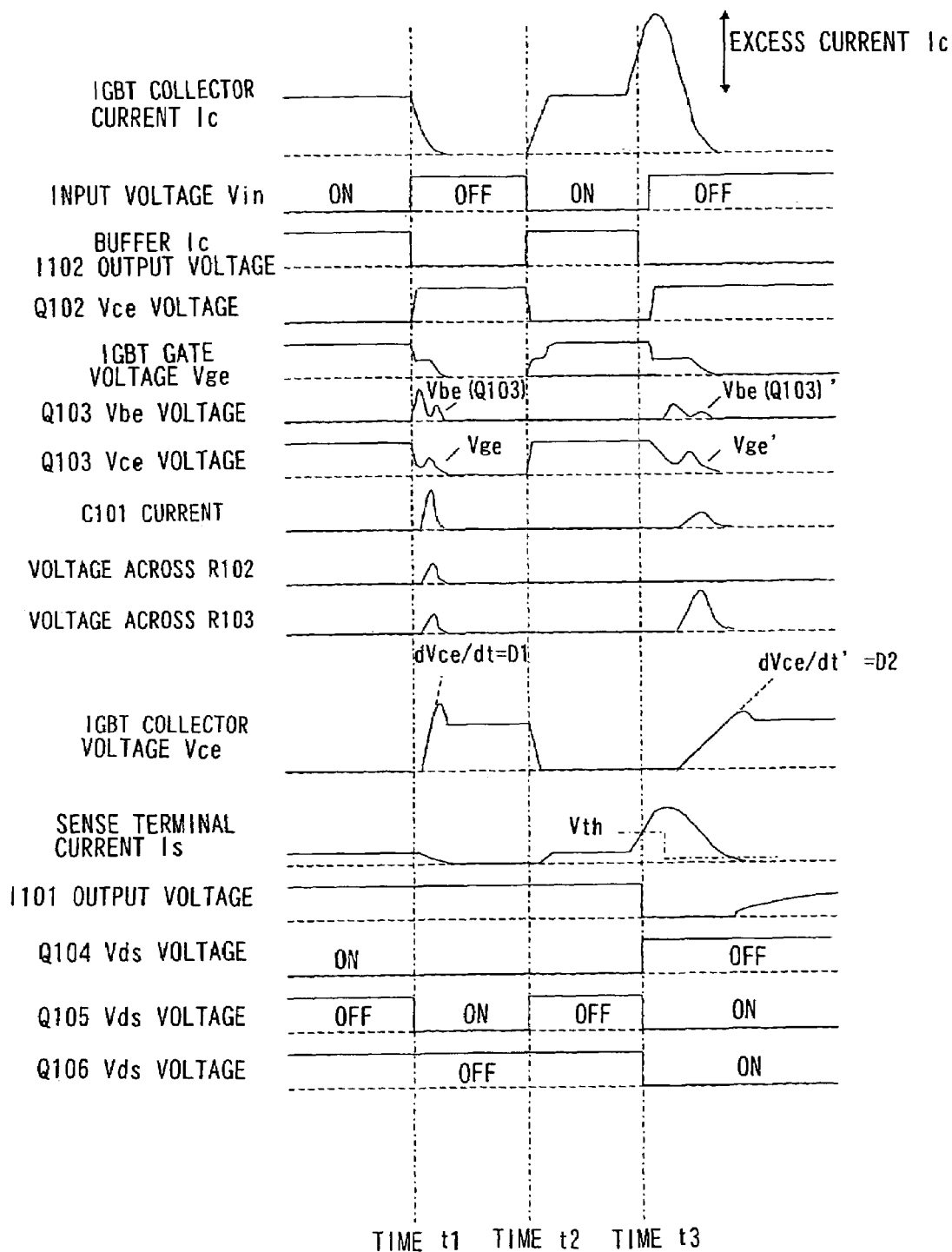
FIG. 2 is a figure for explanation of a signal waveform in a main section of the drive circuit.

The operation of the drive circuit described above will now be explained. FIG. 2 is a figure for explanation of the signal waveforms in the main part of the drive circuit of FIG. 1. In FIG. 2, respective waveforms are shown for the collector electrical current (Ic) of the IGBT (Q101), the input voltage (Vin), the output voltage of the buffer IC (I102), the voltage (Vce) of the transistor (Q102), the gate voltage (Vge) of the IGBT (Q101), the voltage (Vbe) of the transistor (Q103), the voltage (Vce) of the transistor (Q103), the electrical current of the capacitor (C101), the voltage between the two ends of the resistor (R102), the voltage between the two ends of the resistor (R103), the collector voltage (Vce) of the IGBT (Q101), the sense terminal electrical current (Is), the output voltage of the comparator (I101), the voltage (Vds) of the MOSFET (Q104), the voltage (Vds) of the MOSFET (Q105), and the voltage (Vds) of the MOSFET (Q106).

First, the case in which the IGBT (Q101) is turned OFF in the state in which the collector electrical current (Ic) of the IGBT (Q101) is in the proper electrical current range will be explained.

At the time point t1 of FIG. 2, when the higher level controller (not shown in the drawings) has changed the signal level of the input voltage (Vin) from L (Low) level to H (High) level so that the IGBT (Q101) is turned OFF, the buffer IC (I102) changes the inverted signal after impedance conversion from H level to L level (the output voltage of I102).

When the output signal of the buffer IC (I102) changes to L level, the NPN transistor (Q102) for driving turning ON gate shifts from the ON state to the OFFstate, and the collector voltage (the voltage Q102 Vce) of the NPN transistor (Q102) changes from L level to H level. At the same time as this, a voltage difference (the voltage Q103 Vbe) is generated between the base and the emitter of the PNP transistor (Q103) for driving turning OFF gate which is made of a push-pull structure, and the PNP transistor (Q103) shifts from the OFF state to the ON state. By the PNP transistor (Q103) going to ON, the gate electrical charge within the IGBT (Q101) is Discharged via the gate resistor (Rgoff) and the PNP transistor (Q103), and the gate voltage (Vge) of the IGBT (Q101) starts to drop.

It should be understood that, at this time point, the Pch-MOSFET (Q106) is in the OFF state and the Q106 Vds voltage is H level, the Pch-MOSFET (Q105) is in the ON state and the Q105 Vds voltage is L level, and the Nch-MOSFET (Q104) is in the ON state and the Q104 Vds voltage is L level.

Along with the dropping of the gate voltage (Vge) of the IGBT (Q101), at the same time as the interruption of the collector electrical current (Ic) of the IGBT (Q101), the collector voltage (Vce) of the IGBT (Q101) starts to rise. The time variation (dVce/dt) of the collector voltage which is rising is detected by differentiating with the capacitor (C101) (the C101 electrical current), and the voltage which is generated between the two ends of the resistor (R102) by the differentiated electrical current which flows in the capacitor (C101) (the voltage across R102) is fed back to the base voltage of the PNP transistor (Q103) for driving turning OFF gate.

In this case, the voltage Vbe (Q103) between the base and the emitter of the PNP transistor (Q103) for driving turning OFF gate at any time point t is given by the following Equation (1):

$$Vbe(Q103) = Vge - dVce/dt \times C101 \times R102 \times \{1 - \exp(-t/C101/R102)\} \quad (1)$$

$$dVce/dt = D1 \text{ (a constant)}$$

Here, Vge is the gate voltage (between the gate and the emitter) of the IGBT (Q101). dvce/dt is the time variation of the collector voltage of the IGBT (Q101), which is expressed as a constant D1. C101 is the capacitance of the capacitor (C101), and R102 is the resistance value of the resistor (R102).

The second term in the right side of the above Equation (1) is the same as one which gives the time variation of the voltage which is generated between the two ends of said resistor as a transient response equation, when the capacitor and the resistor are connected in series as a differentiation circuit and a voltage change dV/dt which has a predetermined time variation has been inputted to said capacitor.

The above Equation (1) shows that the voltage Vbe (Q103) between the base and the emitter, which determines the operational state of the PNP transistor (Q103) for driving turning OFF gate, changes linearly when the time variation (dVce/dt) of the collector voltage (Vce) which rises when the IGBT (Q101) is turned OFF changes. As a result of the continuous change of the amount of discharge of the gate electrical charge of the IGBT (Q101) due to the fact that the voltage Vbe (Q103) between the base and the emitter of the PNP transistor (Q103) changes, the time variation (dVce/dt) of the collector voltage of the IGBT (Q101) when turned OFF is feedback controlled to a constant value (D1).

When, in the state in which the collector electrical current (Ic) of the IGBT (Q101) is within the normal electrical current range, the IGBT (Q101) is turned OFF in this manner, since the time variation (dVce/dt) of the collector voltage is detected by the gain which is determined by the time constant due to the capacitor (C101) and the resistor (R102), accordingly it is possible to perform continuous feedback control of the operational state of the PNP transistor (Q103) for driving turning OFF gate so as to keep the time variation (dVce/dt) of the collector voltage at the constant value (D1).

During the above described feedback control of the time variation (dVce/dt) of the collector voltage, the time variation (dIc/dt) of the collector electrical current (Ic) of the IGBT (Q101) is kept to a constant value (expressed as d1). As a result, the surge voltage (Vs) which is generated when the IGBT (Q101) is turned OFF is kept to (dIc/dt)×Ls=d1×Ls. Since the above described feedback control for the time variation (dVce/dt) of the collector voltage operates until directly before the turning OFF of the IGBT (Q101) is completed, it is not influenced by the size of the collector electrical current (Ic) of the IGBT (Q101), or by deviations in the characteristics of the IGBT (Q101), and the surge voltage (Vs) due to the IGBT (Q101) is suppressed to a small level.

It should be understood that, since the collector electrical current of the IGBT (Q101) is within the normal electrical current range, the output signal level of the comparator (I101) which is provided for excess electrical current detection is also kept at H level after the time point t1 at which the IGBT (Q101) starts its turning OFF operation. Accordingly, the OFF state of the Pch-MOSFET (Q106) is continued, and the signal level of the input voltage (Vin) from the higher level controller remains, just as it is, at the input signal level of the buffer IC (I102).

When, at the time point t2, the higher level controller (not shown in the figures) changes the input voltage (Vin) from H level to L level so that the IGBT (Q101) is turned ON, the buffer IC (I102) changes the inverted signal after impedance conversion from L level to H level (the I102 output voltage).

When the output level of the buffer IC (I102) changes to H level, the NPN transistor (Q102) for driving turning ON gate shifts from the OFF state to the ON state, and the collector voltage of the NPN transistor (Q102) (the voltage Q102 Vce) changes from H level to L level. At the same time as this, the Pch-MOSFET (Q105) shifts from the ON state to the OFF state, and the voltage Q105 Vds changes from L level to H level. The Pch-MOSFET (Q105) is a switching element which is required for turning the PNP transistor (Q103) for driving turning OFF gate of the IGBT (Q101) to OFF. In other words, by the Pch-MOSFET (Q105) going to OFF, the base terminal of the PNP transistor (Q103) for driving turning OFF gate is connected (pulled up) via the resistor (R103) to the H level of the output of the buffer IC (I102) at this time point. By doing this, the PNP transistor (Q103) for driving turning OFF gate is reliably turned OFF, and the voltage Q103 Vce becomes H level.

Next, the case in which the IGBT (Q101) is turned OFF in the state in which the collector electrical current of the IGBT (Q101) has become excessive will be explained.

A sense terminal electrical current (Is) flows to the resistor (R101) from the sense terminal (S) of the IGBT (Q101) according to the collector electrical current (Ic) of the IGBT (Q101) which is turned ON. The IGBT (Q101) is made so that the ratio of its sense terminal electrical current (Is) and its collector electrical current (Ic) has a predetermined electrical current ratio (which is determined by the device structure of the IGBT).

When the voltage which is generated between the two ends of the resistor (R101) by this sense terminal electrical current (Is) exceeds the threshold voltage value (Vth) at the time point t3 (in other words, when the collector electrical current (Ic) exceeds its permitted value), the calculated comparison output of the comparator (I101) changes from H level to L level. When the output signal of the comparator (I101) changes to L level, the Pch-MOSFET (Q106) shifts from the OFF state to the ON state, and the voltage Q106 Vds goes to L level. Due to this, the IGBT (Q101) is shifted to OFF operation, even if the signal level of the input voltage (Vin) from the higher level controller is at L level, since the input signal of the buffer IC (I102) is connected to the voltage supply (Vcc) (i.e. goes to H level) due to the Pch-MOSFET (Q106) going to ON.

The buffer IC (I102) changes the inverted signal after impedance conversion from H level to L level (the voltage output from I102). When the output signal of the buffer IC (I102) changes to L level, the NPN transistor (Q102) for driving turning ON gate shifts from the ON state to the OFF state, and the collector voltage of this NPN transistor (Q102) (the voltage Q102 Vce) changes from L level to H level. At the same time as this, a voltage difference (the voltage Q103 Vbe) is generated between the base and the emitter of the PNP transistor (Q103) for driving turning off gate which is made of a push-pull structure, and this PNP transistor (Q103) shifts from the OFF state to the ON state. Due to the PNP transistor (Q103) going to ON, the gate electrical charge within the IGBT (Q101) is discharged via the gate resistor (Rgoff) and the PNP transistor (Q103), and the gate voltage (Vge) of the IGBT (Q101) starts to drop.

At this time point, with the Pch-MOSFET (Q106) in the ON state the voltage Q106 Vds is L level, with the Pch-MOSFET (Q105) in the ON state the voltage Q105 Vds is L level, and with the Nch-MOSFET (Q104) in the OFF state the voltage Q104 Vds is H level.

At the same time as the collector electrical current (Ic) of the IGBT (Q101) is interrupted along with the dropping of the gate voltage (Vge) of the IGBT (Q101), the collector voltage (Vce) of the IGBT (Q101) starts to rise. The time variation (dVce/dt) of the collector voltage which is rising is detected by differentiating with the capacitor (C101) (the C101 electrical current), and the voltage which is generated between the two ends of the resistor (R103) by the differential electrical current which flows in the capacitor (C101) (i.e. the voltage across R103) is fed back to the base voltage of the PNP transistor (Q103) for driving turning OFF gate.

In this case, the voltage Vbe (Q103)' between the base and the emitter of the PNP transistor for driving turning OFF gate at any time point t is given by the following Equation (2):

$$Vbe(Q103)'=Vge'-dVce/dt'\times C101\times R103\times\{1-\exp(-t/C101/R103)\} \quad (2)$$

$$dVce/dt'=D2 \text{ (a constant)}$$

Here, Vge' is the voltage between the gate and the emitter of the IGBT (Q101). dVce/dt' is the time variation of the collector voltage of the IGBT (Q101), and is given by the constant D2. C101 is the capacitance of the capacitor (C101), and R103 is the resistance value of the resistor (R103).

Since the detected gain of the time variation (dVce/dt') of the collector voltage of the IGBT (Q101) is changed over to the detection gain if the collector electrical current described above is in the normal range and is fed back to the base voltage of the PNP transistor (Q103) for driving turning OFF gate, accordingly the time variation (dVce/dt') of the collector voltage of the IGBT (Q101) comes to be changed over to the constant value (D2). When the detected gain of the time variation (dVce/dt') of the collector voltage becomes high, the feedback amount to the base voltage of the PNP transistor (Q103) increases and the electrical charge discharge speed becomes slow. Conversely, if the detected gain is low, the electrical charge discharge speed due to the PNP transistor (Q103) becomes high. In this preferred embodiment, the electrical charge discharge speed is controlled by changing over the detection gain between when the collector electrical current is normal and when it is abnormal (i.e. during excess electrical current).

Even if the IGBT (Q101) is turned OFF in the state in which excess electrical current has been generated in the collector current, in the same way as when it is turned OFF in the state in which the collector electrical current is in the normal range, it is possible to suppress the surge voltage (Vs), since the above described feedback control operates until directly before the turning OFF of the IGBT (Q101) is completed.

The IGBT (Q101) turns OFF when the discharge of the gate electrical charge via the gate resistor (Rgoff) and the PNP transistor (Q103) is completed (i.e. when the gate voltage (Vge) becomes zero). On the other hand, the higher level controller (not shown in the drawings) which has received the error signal (110) changes the input voltage (Vin) from L level to H level at a predetermined timing after the time point t3.

The values of the time variation of the collector voltage (dVce/dt)=D1 and (dVce/dt')=D2 are determined during the design process, so that the respective surge voltages (Vs) do not exceed a predetermined range (the rated breakdown voltage of the IGBT (Q101)). The values of D1 and D2 are determined by the resistance values of the respective resistors (R102) and (R103).

Figure 3:
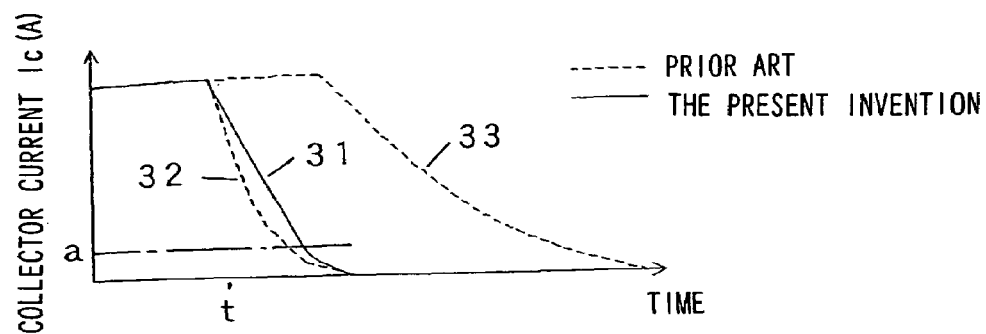
FIG. 3 is a figure showing the variation with time of the collector current, when the IGBT which has generated excess current is turned OFF.

FIG. 3 is a figure showing the change over time of the collector electrical current (Ic) which flows in said IGBT when the IGBT is turned OFF in the state in which an excessive electrical current has been generated in the collector current. In FIG. 3, the horizontal axis shows time, and the vertical axis shows the magnitude of the collector electrical current (Ic). The curved line 31 is the turning OFF curve when turning OFF has been performed by using the drive circuit according to the present invention. The curved line 32 is a turning OFF line when the gate resistance value has been made small by a drive circuit according to a prior art technology. And the curved line 33 is a turning OFF line when the gate resistance value has been made large by a drive circuit according to a prior art technology.

In FIG. 3, the turning OFF operation is started at the time point t. With the drive circuit according to the present invention, the rate of reduction with time is controlled to be almost constant until the collector electrical current (Ic) becomes smaller than a, as shown by the curved line 31. In the case that the gate resistance value has been made small with a prior art technology, as shown by the curved line 32, the rate of reduction of the collector electrical current (Ic) is large after the start of turning OFF, and this rate of reduction becomes smaller along with reduction of the collector electrical current (Ic). And, in the case that the gate resistance value has been made large with a prior art technology, as shown by the curved line 33, the rate of reduction of the collector electrical current (Ic) is small, and the time period until the turning OFF operation is completed is long.

Figure 4:
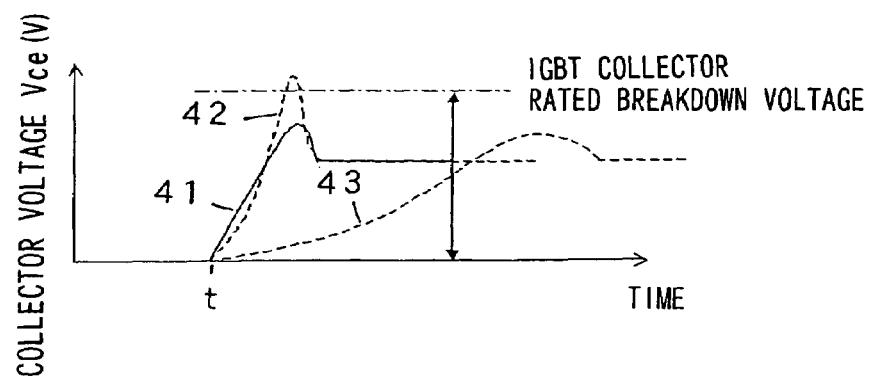
FIG. 4 is a figure showing the variation with time of the collector voltage, when this IGBT which has generated excess current is turned OFF.

FIG. 4 is a figure showing the rate of change over time of the collector voltage (Vce) of said IGBT when the IGBT is turned OFF in the state in which an excess current (over current) has been generated in the collector electrical current. In FIG. 4, the horizontal axis shows time, and the vertical axis shows the magnitude of the collector voltage (Vce). The curved line 41 is the turning OFF curve when turning OFF has been performed by using the drive circuit according to the present invention. The curved line 42 is a turning OFF line when the gate resistance value has been made small by a drive circuit according to a prior art technology. And the curved line 43 is a turning OFF line when the gate resistance value has been made large by a drive circuit according to a prior art technology.

In FIG. 4, the turning OFF operation is started at the time point t. With the drive circuit according to the present invention, the time variation (dVce/dt) of the collector voltage is controlled to be almost constant until the collector electrical current (Ic) becomes smaller than a, as shown by the curved line 41. The peak of the collector voltage (Vce) shown by the curved line 41 is the smallest among the three curved lines 41 through 43. In the case that the gate resistance value has been made small with a prior art technology, as shown by the curved line 42, the peak of the collector voltage (Vce) becomes the greatest, since the rate of reduction of the collector electrical current (Ic) is great. And, in the case that the gate resistance value has been made large with a prior art technology, as shown by the curved line 43, the time variation (dVce/dt) of the collector voltage becomes gentle, but the time period for the turning OFF operation is long.

As is clear from FIGS. 3 and 4, with the drive circuit according to the present invention, it is possible to suppress the peaks of the collector voltage (Vce), with the time period for turning OFF not becoming protracted by increasing the gate resistance value.

The preferred embodiment explained above will now be summarized.

(1) With the drive circuit according to the present invention, when the IGBT (Q101) is turned ON, electrical charge is supplied (charging) from the gate terminal (G) via the resistor (Rgon) by the NPN transistor (Q102) for driving turning ON gate being turned ON; while, when the IGBT (Q101) is turned OFF, electrical charge is discharged from the gate terminal (G) via the resistor (Rgoff) by the PNP transistor (Q103) for driving turning OFF gate being turned OFF.

(2) The ON state of the PNP transistor (Q103) for driving turning OFF gate controls feedback according to the time variation (dVce/dt) of the collector voltage of the IGBT (Q101) Accordingly, it is possible to vary the amount of electrical discharge of the gate electrical charge which is discharged from the gate terminal (G) linearly along with the time variation (dVce/dt) of the collector voltage, and it is possible to control the time variation (dVce/dt) of the collector voltage to a constant value (D1 or D2). By doing this, it is possible to make the time variation (dIc/dt) of the collector electrical current (Ic) roughly constant, and, even during excess electrical current, there is no generation of excessively large surge voltage, and it is possible to turn the IGBT (Q101) OFF in a short period of time (i.e., quickly).

(3) By performing the feedback control according to the time variation (dVce/dt) of the collector voltage, it becomes difficult to experience any influence from deviations of the characteristics of the IGBT (Q101), or from parasitic inductance (Ls) in the collector electrical current transmission path (the bus bars or the like). Due to this, it is possible to performing turning OFF switching so as to keep the surge voltage within a fixed value, irrespective of variation of the characteristics and of the parasitic inductance value.

(4) By arranging that no excessively large surge voltage is generated in the IGBT (Q101), it becomes possible to make the IGBT (Q101) using elements of which the rated breakdown voltage (the collector withstand voltage) is low, and thus it is possible to reduce the size of the IGBT. Furthermore, since it is possible for the IGBT collector saturation voltage to be low, it is also possible to restrict the losses which are generated by the IGBT.

In the above explanation, the gain which detects the time variation (dVce/dt) of the collector voltage is determined by the time constant of the capacitor (C101) and the resistor, and when the gain is to be changed over between when the collector electrical current is normal and when it is excessive, it is arranged to change over this detection gain by changing over between the resistor (R102) and the resistor (R103), whose resistance values are different. Instead of this, it would also be acceptable to provide a capacitor (C102) whose capacitance was different from the capacitance of the capacitor (C101), and to change over the detection gain by changing over between the capacitor (C101) and the capacitor (C102).

Instead of changing over between the capacitor (C101) and the capacitor (C102), it would also be acceptable to connect the capacitor (C102) in parallel with the capacitor (C101), and to change the detected gain by cutting out this parallel connected capacitor (C102).

The above described embodiments are examples, and various modifications can be made without departing from the spirit and scope of the invention.

INCORPORATION BY REFERENCE

The disclosure of the following priority application is herein incorporated by reference:
Japanese Patent Application No. 2004-081571 filed Mar. 19, 2004

What is claimed is:

1. A drive circuit for a voltage driven type semiconductor element, comprising:
   an electrical charge discharge unit that discharges electrical charge from a gate terminal of a voltage driven type semiconductor element when the voltage driven type semiconductor element is turned OFF; and
   an electrical current detection unit that detects a collector electrical current of the voltage driven type semiconductor element; and
   an electrical discharge control unit that detects a time variation of a collector voltage of the voltage driven type semiconductor element, and controls electric discharge by the electrical charge discharge unit according to the time variation of the collector voltage which has been detected and the electrical current value which has been detected by the electrical current detection unit.

2. A drive circuit for a voltage driven type semiconductor element according to claim 1, wherein
   the electrical discharge control unit varies a discharge speed by the electrical charge discharge unit according to the time variation of the collector voltage which has been detected and the electrical current value which has been detected by the electrical current detection unit.

3. A drive circuit for a voltage driven type semiconductor element according to claim 2, wherein:
   the electrical discharge control unit comprises a differentiation circuit which comprises a resistor element and a capacitor element, and which differentiates the variation of the collector voltage of the voltage driven type semiconductor element;
   the electrical charge discharge unit comprises a PNP transistor, whose emitter terminal is connected to the gate terminal of the voltage driven type semiconductor element, and whose collector terminal is connected to an emitter terminal of the voltage driven type semiconductor element; and
   a differentiated output from the differentiation circuit is inputted to a base terminal of the PNP transistor.

4. A drive circuit for a voltage driven type semiconductor element according to claim 3, wherein:
   the resistor element of the differentiation circuit comprises a first resistor element which has a first resistance value, and a second resistor element which has a second resistance value which is greater than the first resistance value, which can be optionally changed over; and the electrical discharge control unit changes over to the first resistor element when the electrical current value which is detected by the electrical current detection unit is less than or equal to a predetermined value, and changes over to the second resistor element when the electrical current value which is detected by the electrical current detection unit is greater than the predetermined value.

5. A drive circuit for a voltage driven type semiconductor element according to claim 1, further comprising:
an electrical charge supply unit that supplies electrical charge to a gate terminal of the voltage driven type semiconductor element when the voltage driven type semiconductor element is turned ON;
the electrical charge supply unit comprising an NPN transistor;
the electrical charge discharge unit comprising a PNP transistor;
a signal output circuit which has a push-pull structure, and which outputs a drive signal to a base terminal of the NPN transistor;
a capacitance element, a first resistor element, and a first switching element which are connected between a collector terminal and an emitter terminal of the voltage driven type semiconductor element, and are connected in series; and
a second resistor element of which one terminal is connected to a connection point of the capacitance element and the first resistor element, and the other terminal is connected to an output terminal of the signal output circuit, wherein:
the connection point of the capacitance element, the first resistor element, and the second resistance element is connected to a base terminal of the PNP transistor; and
a time constant due to the capacitance element and the first resistor element, and a time constant due to the capacitance element and the second resistor element, are changed over between according to a switching state of the first switching element.

6. A drive circuit for a voltage driven type semiconductor element according to claim 5, further comprising:
a second switching element which is connected in series between the first resistor element and the first switching element, and which is changed over according to an output signal level from the signal output circuit, and wherein
the second switching element is turned ON to cause the PNP transistor to operate, by the output signal level which is outputted from the signal output circuit when the voltage driven type semiconductor element is turned OFF.

7. A drive circuit for a voltage driven type semiconductor element according to claim 2, wherein
when the electrical current value which is detected by the electrical current detection unit is greater than or equal to a predetermined value, the electrical discharge control unit controls electrical discharge by the electrical charge discharge unit so that the electrical discharge speed is slower, than when the electrical current value is less than the predetermined value.

8. A drive circuit for a voltage driven type semiconductor element according to claim 2, wherein
the electrical discharge control unit controls electrical discharge by the electrical charge discharge unit so as to make the time variation of the collector voltage constant, and, when the electrical current value which is detected by the electrical current detection unit is greater than or equal to a predetermined value, controls electrical discharge by the electrical charge discharge unit so as to make the time variation of the collector voltage smaller, than when the electrical current value is less than the predetermined value.

9. A drive circuit for a voltage driven type semiconductor element according to claim 2, wherein
the electrical discharge control unit comprises a differentiation circuit which detects the time variation of the collector voltage and feeds back the detected time variation to the electrical charge discharge unit, and varies the discharge speed by the electrical charge discharge unit by changing over a resistor element which constitutes the differentiation circuit, according to the electrical current value which is detected by the electrical current detection unit.

10. A drive circuit for a voltage driven type semiconductor element according to claim 1, wherein
the electrical discharge control unit controls electrical discharge by the electrical charge discharge unit so as to bring a rate of reduction with time of the collector electrical current of the voltage driven type semiconductor element to approach a predetermined value.

11. A drive circuit for a voltage driven type semiconductor element according to claim 1, wherein
the electrical discharge control unit controls electrical discharge by the electrical charge discharge unit so that the time variation of the collector voltage becomes constant.

12. A drive circuit for a voltage driven type semiconductor element according to claim 1, wherein
the electrical discharge control unit comprises a differentiation circuit which detects the time variation of the collector voltage and feeds back the detected time variation to the electrical charge discharge unit.

13. A drive circuit for a voltage driven type semiconductor element according to claim 1, wherein
the electrical discharge control unit performs feedback control so as to keep the time variation of the collector voltage of the voltage driven type semiconductor element to a constant value, with a detection gain according to the collector electrical current which has been detected by the electrical current detection unit.

14. A drive circuit for a voltage driven type semiconductor element according to claim 1, wherein
the electrical discharge control unit feeds back the detected time variation of the collector voltage to the electrical charge discharge unit, and varies an amount of feedback control according to the collector electrical current which has been detected by the electrical current detection unit.

15. A drive circuit for a voltage driven type semiconductor element according to claim 1, wherein
the electrical discharge control unit detects the time variation of the collector voltage of the voltage driven type semiconductor element with a detection gain according to the collector electrical current which has been detected by the electrical current detection unit, and controls the electric discharge by the electrical charge discharge unit according to the time variation of the collector voltage which has been detected.

16. A drive circuit for a voltage driven type semiconductor element according to claim 15, wherein
the electrical discharge control unit changes over a detection gain according to the collector electrical current which has been detected by the electrical current detection unit.

17. A drive circuit for a voltage driven type semiconductor element according to claim 16, wherein
when the collector electrical current which has been detected by the electrical current detection unit is equal to or higher than a predetermined value, the electrical discharge control unit changes over the detection gain to a value higher than a detection gain in a case that the detected collector electrical current is lower than the predetermined value.

18. A drive circuit for a voltage driven type semiconductor element, comprising:
an electrical charge discharge means for discharging electrical charge from a gate terminal of a voltage driven type semiconductor element when the voltage driven type semiconductor element is turned OFF; and
an electrical current detection means for detecting a collector electrical current of the voltage driven type semiconductor element; and
an electrical discharge control means for detecting a time variation of a collector voltage of the voltage driven type semiconductor element, and for controlling electric discharge by the electrical charge discharge means according to the time variation of the collector voltage which has been detected and the electrical current value which has been detected by the electrical current detection means.

19. A drive circuit for a voltage driven type semiconductor element, comprising:
an electrical charge discharge unit that discharges electrical charge from a gate terminal of a voltage driven type semiconductor element when the voltage driven type semiconductor element is turned OFF;
an electrical discharge control unit that detects a time variation of a collector voltage of the voltage driven type semiconductor element, and controls electric discharge by the electrical charge discharge unit according to the time variation of the collector voltage which has been detected;
an electrical charge supply unit that supplies electrical charge to a gate terminal of the voltage driven type semiconductor element when the voltage driven type semiconductor element is turned ON;
the electrical charge supply unit comprising an NPN transistor;
the electrical charge discharge unit comprising a PNP transistor;
a signal output circuit which has a push-pull structure, and which outputs a drive signal to a base terminal of the NPN transistor;
a capacitance element, a first resistor element, and a first switching element which are connected between a collector terminal and an emitter terminal of the voltage driven type semiconductor element, and are connected in series; and
a second resistor element of which one terminal is connected to a connection point of the capacitance element and the first resistor element, and the other terminal is connected to an output terminal of the signal output circuit, wherein:
the connection point of the capacitance element, the first resistor element, and the second resistance element is connected to a base terminal of the PNP transistor; and
a time constant due to the capacitance element and the first resistor element, and a time constant due to the capacitance element and the second resistor element, are changed over between according to a switching state of the first switching element.

20. A drive circuit for a voltage driven type semiconductor element, comprising:
an electrical charge discharge unit that discharges electrical charge from a gate terminal of a voltage driven type semiconductor element when the voltage driven type semiconductor element is turned OFF;
an electrical discharge control unit that detects a time variation of a collector voltage of the voltage driven type semiconductor element, and controls electric discharge by the electrical charge discharge unit according to the time variation of the collector voltage which has been detected; and wherein
the electrical discharge control unit comprises a differentiation circuit which detects the time variation of the collector voltage and feeds back the detected time variation to the electrical charge discharge unit.

* * * * *